United States Patent [19]
Nojiri et al.

[11] Patent Number: 5,285,514
[45] Date of Patent: Feb. 8, 1994

[54] WAVEGUIDE TYPE PHOTODETECTOR AND A METHOD OF FABRICATING THE SAME

[75] Inventors: Hidetoshi Nojiri, Hadano; Tamayo Hirokio, Zama, both of Japan

[73] Assignee: Canon Kabushiki Kaisha, Tokyo, Japan

[21] Appl. No.: 887,806

[22] Filed: May 26, 1992

[30] Foreign Application Priority Data

May 27, 1991 [JP] Japan ................. 3-151022

[51] Int. Cl.$^5$ ............................. G02B 6/10
[52] U.S. Cl. ........................ 385/131; 372/48; 385/24; 385/2; 257/195; 257/436; 257/466
[58] Field of Search ............. 257/192, 194, 436, 466, 257/195; 372/48; 385/2, 3, 129, 130–132, 24

[56] References Cited
U.S. PATENT DOCUMENTS

| | | | |
|---|---|---|---|
| 4,553,317 | 11/1985 | Sakaki et al. | 29/572 |
| 4,794,609 | 12/1988 | Hara et al. | 372/50 |
| 4,926,431 | 5/1990 | Kawanishi et al. | 372/48 |
| 4,951,290 | 8/1990 | Morimoto et al. | 372/48 |
| 5,109,444 | 4/1992 | Handa et al. | 385/14 |

FOREIGN PATENT DOCUMENTS 4-79283  3/1992  Japan ..................... 372/48

*Primary Examiner*—John D. Lee
*Assistant Examiner*—John Ngo
*Attorney, Agent, or Firm*—Fitzpatrick, Cella, Harper & Scinto

[57] ABSTRACT

In a waveguide type photodetector for receiving and detecting a light guided thereinto, a groove is formed in a semiconductor substrate, a waveguide layer is formed on the semiconductor substrate, and a light absorbing layer for absorbing a light propagated through a waveguide in the waveguide layer is formed on the waveguide layer. The waveguide is formed as a three-dimensional waveguide formed in the waveguide layer due to the presense of the groove. The three-dimensional waveguide is maintained also under the light absorbing layer since the refractive index of a portion layered on the groove formed in the substrate is made large than that of portions other than this portion layered above the groove.

24 Claims, 5 Drawing Sheets

WAVEGUIDE TYPE PHOTODETECTOR AND A METHOD OF FABRICATING THE SAME

BACKGROUND OF THE INVENTION

1. Field of the Invention

The present invention relates to a photodetector of a waveguide type suitable for use in an optical integration circuit and the like, a method of fabricating such a photodetector and an optical communication system wherein such a photodetector is used for receiving a signal light.

2. Related Background Art

FIG. 1 shows a prior art waveguide type photodetector wherein a waveguide structure and a light detecting unit are combined (see U.S. Pat. No. 4,360,246). In FIG. 1, an undoped ($\phi$-) $Al_yGa_{1-y}As$ first clad layer 102 having a thickness of 0.5 μm-1 μm, an undoped $Al_xGa_{1-x}As$ waveguide layer 103 having a relatively large thickness of 2 μm-5 μm and an n-type GaAs active or light absorbing layer 104 having a thickness of 0.1 μm-1 μm are successively layered on a semi-insulating GaAs substrate 101. Here, the relation between the mole fractions x and y is set to x<y in order to make the refractive index of the first clad layer 102 smaller than that of the waveguide layer 103.

The n-type GaAs light absorbing layer 104 is formed in an island shape on the $\phi$-$Al_xGa_{1-x}As$ waveguide layer 103 by using a selective etching of GaAs and AlGaAs to expose the surface of the $\phi$-$Al_xGa_{1-x}As$ waveguide layer 103. Further, an insulating material 105 is formed in a stripe shape on the $\phi$-$Al_xGa_{1-x}As$ waveguide layer 103 to form a three-dimensional waveguide 110. The refractive index of the insulating material 105 such as a silicon dioxide should be larger than that of air. Thus, the equivalent refractive index is made different between the waveguide 110 and portions other than the waveguide 110 to achieve a light confinement in a lateral direction in the waveguide layer 103.

The operation of this device will be described. A signal light 114 enters an end surface 112 of the device and is propagated through the waveguide layer 103. The propagated light is confined by the $\phi$-$Al_yGa_{1-y}As$ first clad layer 102 acting as a lower clad layer and the insulating material 105 acting as an upper clad layer and reaches the n-GaAs layer 104 at a position indicated by an A—A' line. The refractive index of the n-GaAs layer 104 is larger than that of the waveguide layer 103, and therefore, the propagated light leaks out from the waveguide 110 to the n-GaAs layer 104. The leaking light is absorbed by the n-GaAs layer 104, and electrons and holes are generated therein. The light detecting unit in this prior art device has a field effect transistor (FET) structure including a source electrode 106, a drain electrode 107 and a gate electrode 108. The former two electrodes 106 and 107 are respectively ohmic electrodes while the latter one electrode 108 is a Schottky electrode. Therefore, the electrons are taken out by the ohmic electrodes 106 and 107 formed on the light absorbing layer 104, and the light detection is thus performed. The holes are taken out by the gate electrode 108. The gate electrode 108 functions to generate a depletion layer in the light absorbing layer 104 and thus controls a dark current and a drain current.

In the prior art device, however, the photon energy $E_s$ of the input signal light 114 or propagated light must be in the following range since the light 114 is to be propagated through the $\phi$-$Al_xGa_{1-x}As$ waveguide layer 103:

$$1.42 < E_s < 1.42 + 1.247x (eV).$$

When the calculaton is performed by substituting the numerals of x disclosed in the above USP into this formula and the photon energy $E_s$ is converted to the wavelength, the wavelength is found to be in a range between 0.64 μm and 0.87 μm. If a mode calculation of the waveguide 110 is conducted on the basis of this wavelength range, the waveguide 110 turns out to have a multi-mode. The propagated light will have a higher order mode and its speed will be slow when the waveguide has a multi-mode. As a result, compared an electric signal output from the photodetector with an input signal thereinto, the output signal has a wave shape with a dull rise. Further, an S/N ratio is lowered.

Furthermore, it is difficult to make the thickness of the mixed crystal uniform, and the lateral confinement of the three-dimensional waveguide 110 is weak since this confinemnet is performed only by utilizing the difference in the refractive index between the insulating material 105 and the air. Moreover, the absorption edge of the waveguide 110 is dull since the waveguide 110 is formed using the mixed crystal, and therefore, the wavelength of the input signal light 114 should be considerably longer than the absorption edge.

The width of the absorption layer 104 should be less than or at most a little larger than that of the waveguide 110 for the propagated light must be three-dimensionally guided with a little expansion also under the light detecting portion. Therefore, a fine working process should be used when the device is fabricated.

SUMMARY OF THE INVENTION

It is an object of the present invention to provide a waveguide type photodetector in which a light can be effectively absorbed, a rise and a fall of an electric signal output therefrom are improved and the S/N ratio is enhanced, and a method of fabricating such a waveguide type photodetector.

It is another object of the present invention to provide an optical communication system in which the above-mentioned photodetector is used for receiving a signal light.

According to one aspect of a photodetector of the present invention, the photodetector includes a semiconductor substrate having a groove formed therein, a waveguide layer formed on the semiconductor substrate, and a light absorbing layer for absorbing a light propagated through a waveguide, formed on the waveguide layer. A three-dimensional waveguide is formed in the waveguide layer by the groove, and the three-dimensional waveguide is maintained also under the light absorbing layer since the refractive index of a portion layered on the groove formed in the substrate is made large than that of portions other than this portion layered above the groove.

According to one aspect of a method of fabricating a photodetector of the present invention, the method comprises the steps of: forming a groove in a semiconductor substrate, forming a waveguide layer on the semiconductor substrate, and forming a light absorbing layer for absorbing a light propagated through a waveguide, on the waveguide layer. A three-dimensional waveguide is formed in the waveguide layer by the groove, and the three-dimensional waveguide is maintained also under the light absorbing layer since the refractive index of a portion layered on the groove formed in the substrate is made large than that of portions other than this portion layered above the groove.

In the above-discussed structure and the process, a first clad layer may be formed between the substrate and the waveguide layer, the first clad layer being made of a material whose band gap is larger than that of a material of the substrate, and a second clad layer may be formed between the waveguide layer and the light absorbing layer, the second clad layer being made of the same material as that of the first clad layer. A layer thickness of the second clad layer may have such a magnitude that a foot portion of an electromagnetic field distribution of the propagated light overlaps the light absorbing layer at least partly. The waveguide layer may have a superlattice structure. The light absorbing layer may be made of a material whose band gap is narrower than the band gap corresponding to an energy of the propagated light and which has a high mobility. A carrier take-out electrode for detecting carriers generated by the light absorbed in the light absorbing layer may be formed on the light absorbing layer. The photodetector may have a field effect transistor structure.

In the present invention, the groove is formed in the substrate and its width and depth are controlled. Further, a double-hetero structure or the like is adopted. Therefore, an inner-stripe type three-dimensional waveguide having a single mode can be formed right after the growth of layers on the substrate. As a result, a light signal is effectively absorbed by a light detecting portion, a rise and a fall of an electric signal output from the light detecting portion are improved and a high S/N ratio is obtained.

These advantages and others will be more readily understood in connection with the following detailed description, claims and drawings.

DESCRIPTION OF THE PREFERRED EMBODIMENT

First Embodiment

FIGS. 2, 3A-3C and 4 show a first embodiment of a waveguide type photodetector according to the present invention.

Figure 3A:
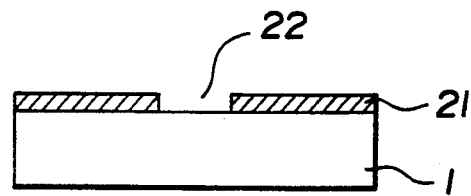
FIGS. 3A-3C are views illustrating a method of fabricating a groove in a substrate of the first embodiment.
Figure 3B:
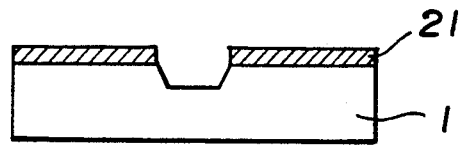
Figure 3C:
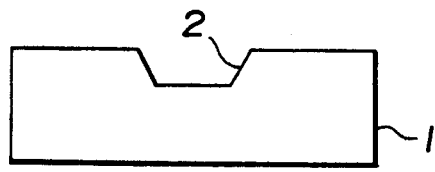

As shown in FIG. 3A, a negative resist 21 (e.g., RD2000N: produced by Hitachi Kasei Inc.) is spin-coated on a semi-insulating GaAs substrate 1, and stripes 22 having a width of 2 $\mu$m and a pitch of 500 $\mu$m are formed on the substrate 1 using an aligner or exposure apparatus with a deep-UV light source. After the stripe 22 is formed as shown in FIG. 3A, an etching of the GaAs substrate 1 is performed as shown in FIG. 3B. Wet etching is used, and its etchant is $NH_4OH + H_2O_2 + H_2O$ (its ratio; $NH_4OH:H_2O_2:H_2O = 3:1:100$). The etching rate for an undoped GaAs is about 100 Å/min.

Figure 1:
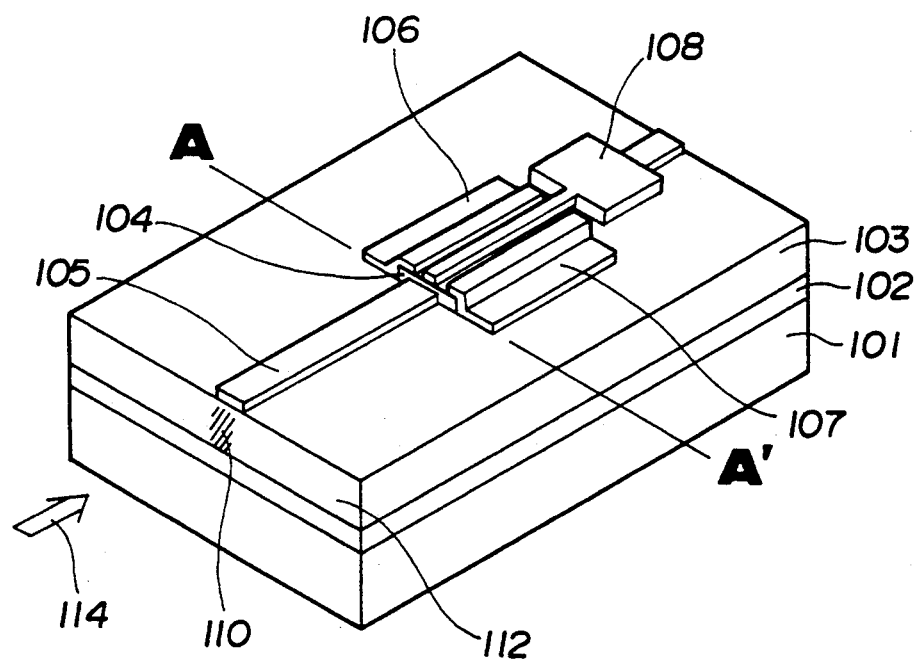
FIG. 1 is a perspective view of a prior art waveguide type photodetector.
Figure 2:
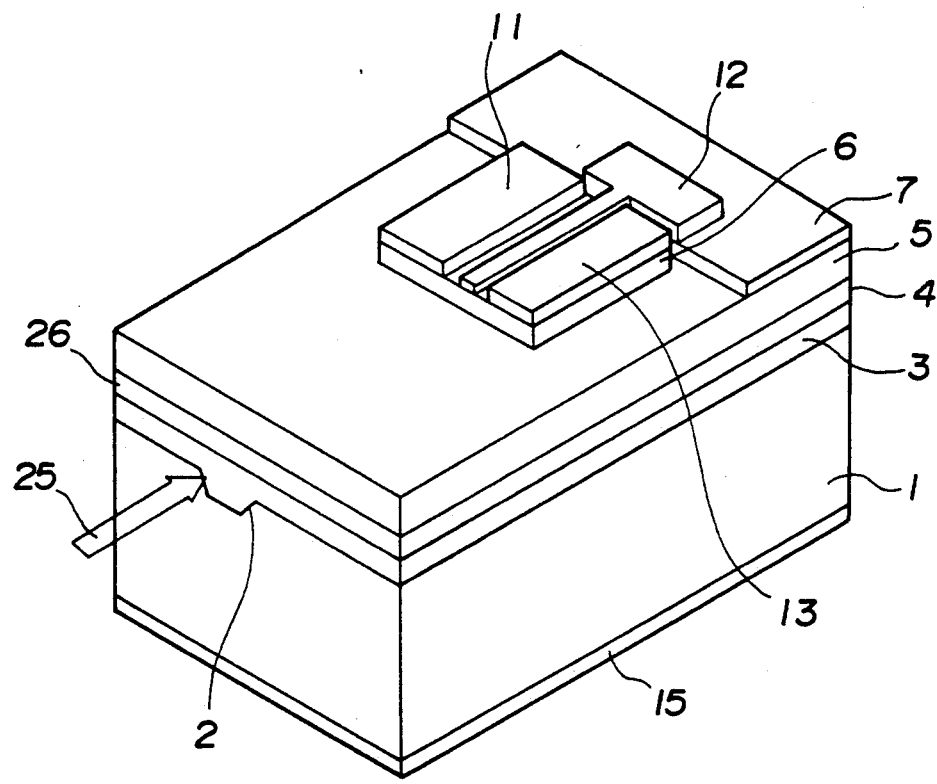
FIG. 2 is a perspective view of a first embodiment of a waveguide type photodetector according to the present invention.

After a groove 2 is formed in the substrate 1 in the above manner, a layer growth is performed using an MO-CVD apparatus. As shown in FIG. 2, a first clad layer 3 of a $\phi$-$Al_{0.5}Ga_{0.5}As$ layer having a thickness of 1.0 $\mu$m, a waveguide layer 4 of a superlattice or multiple quantum well (MQW) structure layer having a thickness of 0.39 $\mu$m and consisting of alternately layered $\phi$-$Al_{0.5}Ga_{0.5}As$ barrier layers (a thickness of 30 Å) and $\phi$-GaAs well layers (a thickness of 60 Å) and a second clad layer 5 of a $\phi$-$Al_{0.5}Ga_{0.5}As$ layer having a thickness of 0.3 $\mu$m are successively layered on the semi-insulating GaAs substrate 1.

An active layer 6 of an n-GaAs layer having a thickness of 0.2 $\mu$m doped with Si of a concentration of $1.0 \times 10^{17}$ cm$^{-3}$ is then regrown on the thus fabricated wafer. For those structures, liquid phase epitaxy (LPE) method, molecular beam epitaxy (MBE) method, metal organic-chemical vapor deposition (MO-CVD) method and the like may be used as a crystal growth process.

A light receiving or detecting portion is then produced. Since the light receiving portion has a field effect transistor (FET) structure, source and drain electrodes 11 and 13 functioning as an ohmic electrode for detecting carriers generated by absorbed light are formed with Au-Ge/Ni/Au and a gate electrode 12 is formed by an Al deposition. As to sizes of the device, the gate length is 1 $\mu$m, the gate width is 100 $\mu$m, the distance between the source 11 and the drain 13 is 1 $\mu$m and the distance between the gate 12 and the drain 13 is 2 $\mu$m. A silicon dioxide ($SiO_2$) insulating layer 7 is formed between the second clad layer 5 and the gate electrode 12. In FIG. 2, only a part of the insulating layer 7 is depicted. In fact the insulating layer 7 is also formed in a portion indicated by a parenthesis.

The device process of the light receiving portion is performed in the following manner:

(1) The n-GaAs of the active layer 6 is selectively etched by the photolithography after the active layer 6 is layered on the second clad layer 5. In a case of wet etching, the selective etching is conducted using an etchant of an ammonium solution (1 cc) and a $H_2O_2$ solution (200 cc), while in a case of dry etching only GaAs is selectively etched by reactive ion etching (RIE) method using a $CCl_2F_2$ gas.

(2) After the resist mask of the photolithography is peeled, a silicon dioxide 7 is deposited by a sputtering deposition system to protect the surface.

(3) Other portions than the active layer 6 are covered with a resist by the photolithography, and the etching of the silicon dioxide on the surface of the active layer 6 is conducted using a buffered HF solution (BHF).

(4) A patterning of the source and drain electrodes 11 and 13 is performed.

(5) An Au-Ge/Ni/Au is continuously deposited.

(6) The Au-Ge/Ni/Au in other portions than the electrode portions 11 and 13 is lift off by peeling the resist with an AZ remover.

(7) An alloying is performed to obtain an ohmic contact between the active layer 6 and the electrodes 11 and 13.

(8) A patterning of draw-out electrodes for achieving a wire bonding for the respective electrodes is performed.

(9) A Cr/Au is continuously deposited.

(10) The Cr/Au in other portions than the draw-out electrode portions is lift off by peeling the resist with an AZ remover.

(11) A patterning of the gate electrode 12 is conducted.

(12) A material of Al of the gate electrode 12 is deposited using a resistance heating.

(13) The Al in other portions than the gate electrode portion 12 is removed by peeling the resist with a remover.

(14) A surface protection layer is deposited (not shown).

(15) A wire bonding pad portion is removed by the photolithography (not shown).

(16) The semi-insulating substrate 1 is mechanically lapped to reduce the thickness of the entire device to 100 μm to 150 μm.

(17) An Au-Ge/Au is continuously deposited on the bottom surface of the substrate 1. This step is relatively readily performed since no patterning is needed.

(18) An alloying is performed to obtain an ohmic contact between the substrate 1 and an bottom electrode 15.

(17) The device is fixed to a package substrate to establish a contact with its exterior.

Figure 4:
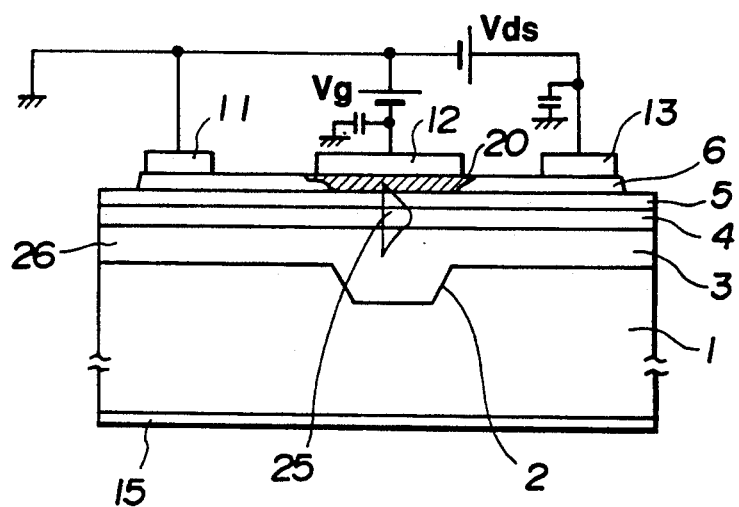
FIG. 4 is a cross-sectional view illustrating an operation of the first embodiment.
Figure 5:
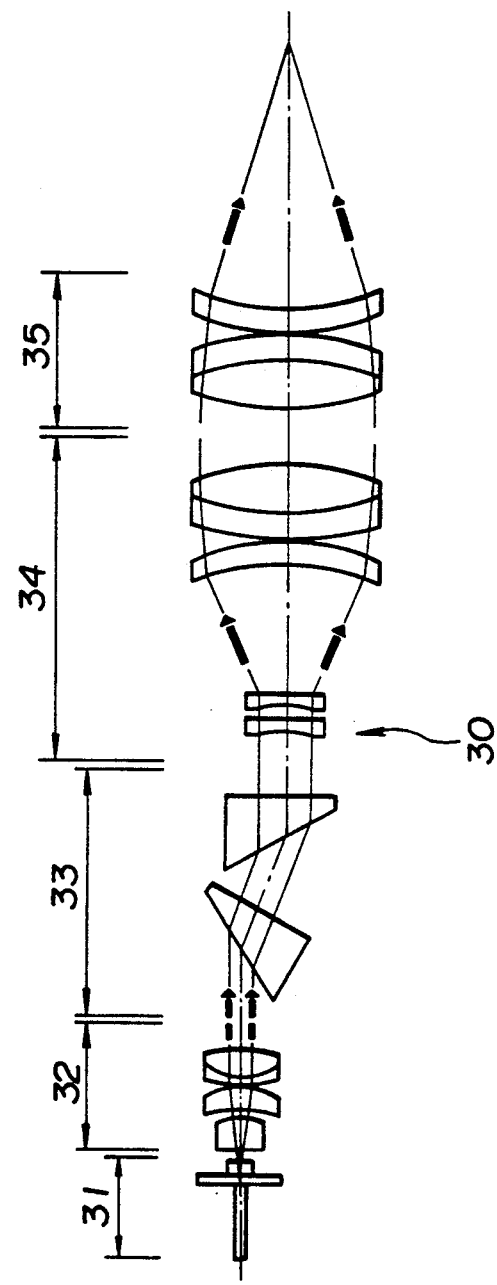
FIG. 5 is a view of an entire optical system for inputting a light signal into a photodetector of the present invention.

The operation of the thus fabricated device will be described referring to FIG. 4. As shown in FIG. 4, a positive voltage $V_{ds}$ relative to the source electrode 11 is applied to the drain electrode 13, and a negative voltage $V_g$ relative to the source electrode 11 is applied to the gate electrode 12. Since the gate electrode 12 is a Schottky electrode, the application of a reverse bias voltage thereto causes a depletion layer 20 in the active layer 6. The width of the depletion layer 20 varies depending on the gate voltage $V_g$, and the width of a channel is changed accordingly. As a result, a drain current $I_d$ flowing between the drain electrode 13 and the source electrode 11 is varied.

When the depletion layer 20 reaches the second clad layer 5, the channel is closed and the drain current $I_d$ ceases to flow. The pinch-off voltage of the gate voltage is known from the $I_d$–$V_{ds}$ characteristic of the fabricated FET structure, and its value is approximately $V_g = -3$ V.

The wavelength λ of the signal light 25 is λ = 830 nm (its photon energy E = 1.494 eV), and the signal light 25 is coupled to the waveguide layer 4 by the optical system 30. The optical system 30 includes a laser diode 31, a collimator 32, an anamorphic prism pair 33, a beam expander 34 and a receiver lens 35.

When the FET structure is to be operated as a photodetector, the gate voltage should be set to the pinch-off voltage to improve the response characteristic. In this embodiment, the gate voltage $V_g$ is set to $V_g = -3$V. Further, the drain voltage $V_{ds}$ is normally set to 1 V to 5 V, and this voltage is set to $V_{ds} = 1.5$ V in this embodiment. A dark current at this time is about 10 nA.

The signal light 25 input into an end surface 26 shown in FIG. 2 is propagated through the superlattice waveguide layer 4 and reaches a portion between the source 11 and the drain 13 of the FET light receiving portion.

Since the band gap of the n-GaAs active layer 6 is approximately equal to 1.4 eV, the signal light 25 at the FET light receiving portion is absorbed by the n-GaAs active layer 6 and electrons and holes are generated therein. The electrons generated by such absorption arrive at the drain electrode 13 due to the electric field between the gate electrode 12 and the drain electrode 13. The electrons between the gate 12 and the source 11 go towards the drain electrode 13 while diffusing in the depletion layer 20. A current resulting from the electrons is, however, very small, so that it is difficult to measure this current as a photocurrent taken out to the exterior.

The holes diffuse and move to the depletion layer 20 near the gate 12 due to the electric field between the gate 12 and the drain 13, similarly to the electrons. The holes in the depletion layer 20 are drifted by the electric field and reach the gate electrode 12. As a result, a potential barrier applied to the gate electrode 12 is lowered, and the depletion layer 20 is contracted. A channel is present in the active layer 6 of the FET structure solely while the depletion layer 20 is contracted, and hence the electrons move from the source electrode 11 and the drain electrode 13 to cause a flow of the drain current. Different from the above-mentioned photocurrent, this drain current has a value determined from the drain voltage and the gate voltage, and therefore, these voltages must be determined considering a ratio between amplitudes of the signal light and the dark current.

The holes reached the gate electrode 12 are drawn out into an external circuit and are recombined in a capacitor in the external circuit. The holes are thus extinguished. At the same time the potential barrier applied to the gate 12 is returned to an original state before the input of the signal light. As a result, the depletion layer 20 extends to close the channel in the active layer 6, and the drain current ceases to flow.

In this embodiment, since the waveguide is formed in a single mode configuration, the rise of an electric signal output from the light detecting portion is improved. Further, the waveguide has an MOW structure, so that even a light signal having a wavelength considerably near the absorption edge can be propagated.

Second Embodiment

Figure 6:
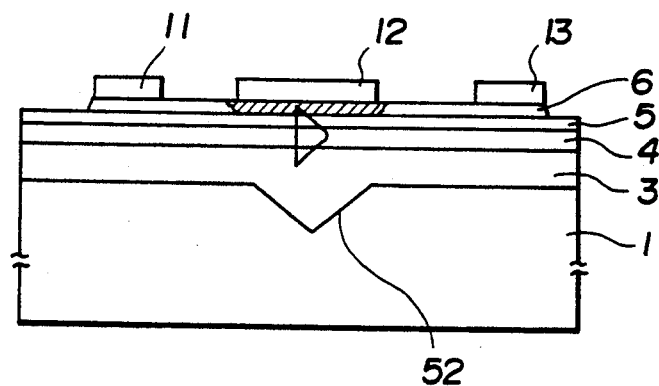
FIG. 6 is a cross-sectional view of a second embodiment of a waveguide type photodetector according to the present invention.

FIG. 6 shows a second embodiment of a waveguide type photodetector according to the present invention.

In FIG. 6, a V-shaped groove 52 is formed in the semiconductor substrate 1. In a process of forming the groove 52, initially a stripe having a width of 2 μm is formed on the (100) GaAs substrate 1 extending in its <110> direction with a pitch of 500 μm, using a resist. After that, the V-shaped groove 52 having a depth of 1.2 μm and a width of 4 μm is formed by an etchant of $H_2O + H_2O_2 + NH_4OH$ (its ratio is equal to $H_2O:H_2O_2:NH_4OH = 50:2:1$).

The succeeding growth process and photolithography process are the same as those of the first embodiment. In this embodiment, however, the growth speed in the surface orientation of the V-shaped groove 52 is higher than that on the (100) surface. As a result, the growth layer thickness on the flat portion other than the V-shaped groove 52 becomes small as shown in FIG. 6. Therefore, the light signal in the other portions that the V-shaped groove 52 is absorbed by the substrate 1. Thus, the propagated light is confined in the V-shaped waveguide even more effectively.

The material used in the present invention is not limited to GaAs/AlGaAs series, but other III-V group and II-VI group compound semiconductor materials and IV group semiconductor materials such as Si can be also used with the same effects. Further, the type of the photodetector in the present invention is not limited to the FET type, but metal-semiconductor-metal (MSM) type and so on can be also used with the same structure and effects. The inner stripe groove structure in the present invention is not limited to the above-discussed concave and V-shaped grooves, either.

As explained above, according to the present invention, the three-dimensional waveguide structure of the waveguide type photodetector can be fabricated by a single layer growth process after the process of forming the groove, and the expansion of the propagated light under the light detecting portion such as an FET structure can be reduced effectively.

The growth surface is nearly flat, so that the process of fabricating the FET structure is facilitated. The waveguide type FET photodetector of the present invention outputs an extremely large photocurrent compared with the conventional waveguide type phototransistor, and its output is linear with respect to the light signal. Therefore, the photodetector of the present invention can be applied to an analog transmission. Thus, this photodetector is quite effective as a light receiving device in optical communications and information processings. Further, this device can be combined with electric devices such as a resistance and a capacitance. The combined device can be used in a novel integrated function device.

Figure 7:
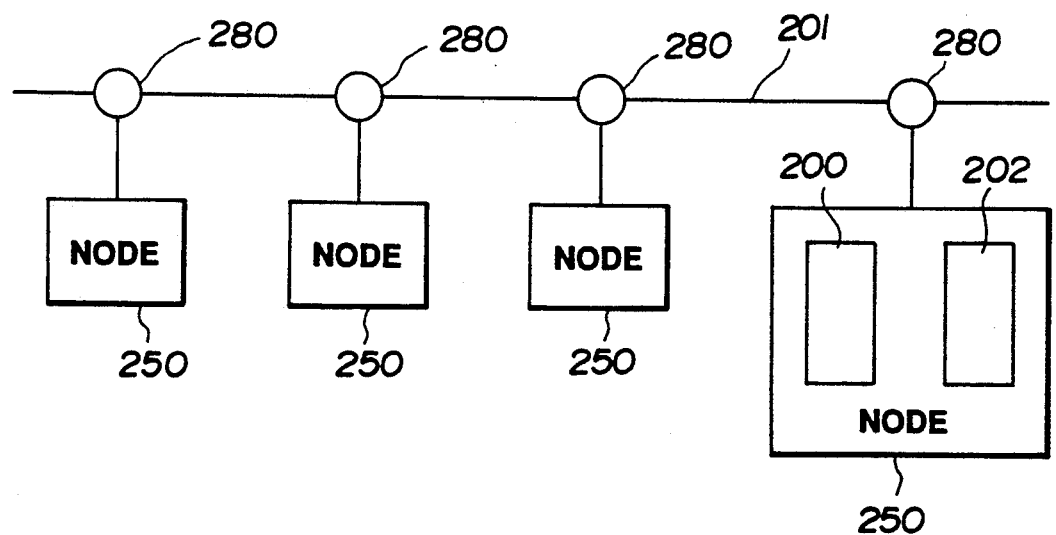
FIG. 7 is a view of a bus type LAN system in which a photodetector according to the present invention is used for receiving a light signal.

FIG. 7 shows a bus type optical local area network (LAN) in which the photodetector of the present invention is used. This system includes a transmitter portion 200, a light transmission line 201 and a receiver portion 202.

The transmitter portion 200 contains a light source such as a semiconductor laser, a light modulation circuit and so forth. The receiver portion 202 contains a photodetector, an amplifier, a filter, a signal processor and so forth. This photodetector is that of the present invention.

A light signal transmitted from the transmitter portion 200 in one node 250 is received by the receiver portion 202 in another node 250 through a coupler 280 connected to the former node 250, the optical transmission line 201 and the coupler 280 connected to the latter node 250. The signal is detected by the photodetector of the present invention and is processed by other electronic circuits such as the amplifier, the filter and the signal processor to be an output signal.

As an access control system, carrier sense multiple access (CSMA)/collision detection (CD), token passing system or the like can be utilized. A high-speed optical communication can be attained by using the photodetector of the present invention in the system. The photodetector of the present invention can be naturally used in any type of an optical communication system (such as a loop type and a star type).

While the present invention has been described with respect to what is presently considered to be the preferred embodiment, it is understood that the invention is not limited to the disclosed embodiments. The present invention is intended to cover various modifications and equivalent arrangements included within the spirit and scope of the appended claims.

What is claimed is:

1. A waveguide type photodetector
   a semiconductor substrate having a groove formed at a position therein;
   a waveguide layer formed on said semiconductor substrate such as to provide a three-dimensional waveguide at a position in said waveguide layer which position is determined by the position of said groove in said substrate;
   a light absorbing layer for absorbing a light propagated through said waveguide, said light absorbing layer being formed on said waveguide layer; and
   a carrier take-out electrode for detecting carriers generated by the light absorbed in said light absorbing layer, said electrode being formed on said light absorbing layer.

2. A photodetector according to claim 1, further comprising a first clad layer formed between said substrate and said waveguide layer, said first clad layer being made of a material whose band gap is larger than the band gap of a material of said substrate, and a second clad layer formed between said waveguide layer and said light absorbing layer, said second clad layer being made of the same material as that of said first clad layer.

3. A photodetector according to claim 2, wherein a layer thickness of said second clad layer has such a magnitude that a side portion of an electromagnetic field distribution of the propagated light overlaps said light absorbing layer.

4. A photodetector according to claim 1, wherein said waveguide layer has a superlattice structure.

5. A photodetector according to claim 1, wherein said light absorbing layer is made of a material whose band gap is narrower than the band gap corresponding to an energy of the propagated light and which has a high mobility.

6. A method of fabricating a waveguide type photodetector comprising the steps of:
   forming a groove at a position in a semiconductor substrate;
   forming a waveguide layer on said semiconductor substrate such as to provide a three dimensional waveguide at a position in said waveguide layer which position is determined by the position of said groove in said substrate;
   forming a light absorbing layer on said waveguide layer for absorbing a light propagated through said waveguide; and
   forming a carrier take-out electrode on said light absorbing layer for detecting carriers generated by the light absorbed in said light absorbing layer.

7. A method according to claim 6, further comprising a step of forming a first clad layer formed between said substrate and said waveguide layer, said first clad layer being made of a material whose band gap is larger than the band gap of a material of said substrate, and a step of forming a second clad layer formed between said waveguide layer and said light absorbing layer, said second clad layer being made of the same material as that of said first clad layer.

8. A method according to claim 7, wherein a layer thickness of said second clad layer has such a magnitude that a side portion of an electromagnetic field distribution of the propagated light overlaps said light absorbing layer.

9. A method according to claim 6, wherein said waveguide layer has a superlattice structure.

10. A method according to claim 6, wherein said light absorbing layer is made of a material whose band gap is narrower than the band gap corresponding to an energy of the propagated light and which has a high mobility.

11. A method according to claim 6, wherein said groove has a V shape.

12. A bus type local area network system comprising:
a plurality of nodes each comprising a receiver portion, said receiver portion including a photodetector and said photodetector comprising a semiconductor substrate having a groove formed at a position therein, a waveguide layer formed on said semiconductor substrate, a three-dimensional waveguide being provided at a position in said waveguide layer which position is determined by the position of said groove in said substrate, and a light absorbing a light propagated through said waveguide, said light absorbing layer being formed on said waveguide layer; and
a light transmission line for connecting said nodes with one another.

13. An optical communications system comprising:
a plurality of nodes each comprising a receiver portion, said receiver portion including a photodetector and said photodetector comprising a semiconductor substrate having a groove formed at a position therein, a waveguide layer formed on said semiconductor substrate, a three-dimensional waveguide being provided at a position in said waveguide layer which position is determined by the position of said groove in said substrate, and a light absorbing layer for absorbing a light propagated through said waveguide, said light absorbing layer being formed on said waveguide layer; and
light transmission line for connecting said nodes.

14. A waveguide type photodetector comprising:
a semiconductor substrate having a groove formed at a position therein;
a waveguide layer formed on said semiconductor substrate such as to provide a three-dimensional waveguide at a position in said waveguide layer which position is determined by the position of said groove in said substrate;
a light absorbing layer for absorbing a light propagated through said waveguide, said light absorbing layer being formed on said waveguide layer;
source and drain electrodes for supplying a drain current flowing therebetween, said source and drain electrodes formed on said light absorbing layer; and
a gate electrode for providing a depletion layer which controls the drain current in said waveguide layer, said gate electrode formed on said light absorbing layer;
wherein when carriers are generated by the light absorbed in said light absorbing layer, said depletion layer is contracted by said carriers so that the drain current is varied.

15. A photodetector according to claim 14, further comprising a first clad layer formed between said substrate and said waveguide layer, said first clad layer being made of a material whose band gap is larger than the band gap of a material of said substrate, and a second clad layer formed between said waveguide layer and said light absorbing layer, said second clad layer being made of the same material as that of said first clad layer.

16. A photodetector according to claim 15, wherein a layer thickness of said second clad layer has such a magnitude that a side portion of an electromagnetic field distribution of the propagated light overlaps said light absorbing layer.

17. A photodetector according to claim 14, wherein said waveguide layer has a superlattice structure.

18. A photodetector according to claim 14, wherein said light absorbing layer is made of a material whose band gap is narrower than the band gap corresponding to an energy of the propagated light and which has a high mobility.

19. A method of fabricating a waveguide type photodetector comprising the steps of:
forming a groove at a position in a semiconductor substrate;
forming a wave guide layer on said semiconductor substrate such as to provide a three-dimensional waveguide at a position in said waveguide layer which position is determined by the position of said groove in said substrate;
forming a light absorbing layer for absorbing a light propagated through said waveguide on said waveguide layer;
forming source and drain electrodes on said light absorbing layer for supplying a drain current flowing therebetween; and
forming a gate electrode on said light absorbing layer for providing a depletion layer which controls the drain current in said waveguide layer,
wherein when carriers are generated by the light absorbed in said light absorbing layer, said depletion layer is contracted by said carriers so that the drain current is varied.

20. A method according to claim 19, further comprising a step of forming a first clad layer between said substrate and said waveguide layer, said first clad layer being made of a material whose band gap is larger than the band gap of a material of said substrate, and a step of forming a second clad layer between said waveguide layer and said light absorbing layer, said second clad layer being made of the same material as that of said first clad layer.

21. A method according to claim 20, wherein a layer thickness of said second clad layer has such a magnitude that a side portion of an electromagnetic field distribution of the propagated light overlaps said light absorbing layer.

22. A method according to claim 19, wherein said waveguide layer has a superlattice structure.

23. A method according to claim 19, wherein said light absorbing layer is made of a material whose band gap is narrower than the band gap corresponding to an energy of the propagated light and which has a high mobility.

24. A method according to claim 19 wherein said groove has a V shape.

* * * * *

UNITED STATES PATENT AND TRADEMARK OFFICE
CERTIFICATE OF CORRECTION

PATENT NO. : 5,285,514
DATED : February 8, 1994
INVENTOR(S) : HIDETOSHI NOJIRI ET AL.   Page 1 of 2

It is certified that error appears in the above-identified patent and that said Letters Patent is hereby corrected as shown below:

On the title page:

AT [54] INVENTORS

"Tamayo Hirokio" should read --Tamayo Hiroki--.

AT [57] ABSTRACT

Line 10, "presense" should read --presence--.

COLUMN 2

Line 7, "USP" should read --U.S. Patent--.
Line 15, "compared" should read --comparing--.
Line 38, "a" should be deleted.

COLUMN 4

Line 7, "ratio;" should read --ratio:--.

COLUMN 6

Line 42, "MOW" should read --MQW--.

COLUMN 8

Line 1, "photodetector" should read
--photodetector comprising:--.

UNITED STATES PATENT AND TRADEMARK OFFICE
CERTIFICATE OF CORRECTION

PATENT NO. : 5,285,514
DATED : February 8, 1994
INVENTOR(S) : HIDETOSHI NOJIRI ET AL.

It is certified that error appears in the above-identified patent and that said Letters Patent is hereby corrected as shown below:

COLUMN 9

Line 35, "light" should read --a light--.

COLUMN 10

Line 61, "claim 19" should read --claim 19,--.

Signed and Sealed this

Thirteenth Day of December, 1994

Attest:

BRUCE LEHMAN

*Attesting Officer*  *Commissioner of Patents and Trademarks*